US010068990B2

United States Patent
Yin et al.

(10) Patent No.: US 10,068,990 B2
(45) Date of Patent: Sep. 4, 2018

(54) METHOD OF MANUFACTURING MOS TRANSISTOR WITH STACK OF CASCADED NANOWIRES

(71) Applicants: Huaxiang Yin, Beijing (CN); Xiaolong Ma, Beijing (CN); Weijia Xu, Beijing (CN); Qiuxia Xu, Beijing (CN); Huilong Zhu, Poughkeepsie, NY (US)

(72) Inventors: Huaxiang Yin, Beijing (CN); Xiaolong Ma, Beijing (CN); Weijia Xu, Beijing (CN); Qiuxia Xu, Beijing (CN); Huilong Zhu, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 196 days.

(21) Appl. No.: 14/387,830

(22) PCT Filed: Aug. 6, 2013

(86) PCT No.: PCT/CN2013/080893
§ 371 (c)(1),
(2) Date: Sep. 24, 2014

(87) PCT Pub. No.: WO2015/000205
PCT Pub. Date: Jan. 8, 2015

(65) Prior Publication Data
US 2016/0233317 A1    Aug. 11, 2016

(30) Foreign Application Priority Data
Jul. 2, 2013   (CN) .......................... 2013 1 0274977

(51) Int. Cl.
*H01L 29/78*   (2006.01)
*H01L 29/06*   (2006.01)
*H01L 29/66*   (2006.01)
*H01L 29/786*  (2006.01)
*H01L 29/423*  (2006.01)

(52) U.S. Cl.
CPC .... *H01L 29/66795* (2013.01); *H01L 29/0673* (2013.01); *H01L 29/42384* (2013.01); *H01L 29/66439* (2013.01); *H01L 29/78696* (2013.01)

(58) Field of Classification Search
CPC ........... H01L 29/66795; H01L 29/0673; H01L 27/0886; H01L 27/0924
See application file for complete search history.

(56) References Cited

U.S. PATENT DOCUMENTS

| 7,851,790 B2 | 12/2010 | Rachmady et al. | |
|---|---|---|---|
| 2011/0073842 A1* | 3/2011 | Liu | B82Y 10/00 257/24 |
| 2014/0225065 A1* | 8/2014 | Rachmady | H01L 29/42392 257/24 |

FOREIGN PATENT DOCUMENTS

CN    102569409 A    7/2012

* cited by examiner

*Primary Examiner* — Steven Loke
*Assistant Examiner* — Scott Stowe
(74) *Attorney, Agent, or Firm* — Christensen, Fonder, Dardi & Herbert PLLC

(57) ABSTRACT

A MOS transistor with stacked nanowires and a method of manufacturing the same. The transistor may include a stack of cascaded nanowires extending in a first direction on a substrate; a gate stack extending in a second direction across the nanowire stack; source and drain regions disposed on opposite sides of the gate stack in the second direction; and a channel region constituted of the nanowire stack between the source and drain regions. The cascaded nanowires can be formed by repeated operations of etching back, and lateral etching and then filling of grooves, thereby increasing an effective width of the channel, increasing a total area of an effective conductive section, and thus improving a drive current.

13 Claims, 5 Drawing Sheets

METHOD OF MANUFACTURING MOS TRANSISTOR WITH STACK OF CASCADED NANOWIRES

CROSS-REFERENCE TO RELATED APPLICATION(S)

This application is a National Phase application of PCT Application No. PCT/CN2013/080893, filed on Aug. 6, 2013, entitled "METHOD OF MANUFACTURING MOS TRANSISTOR WITH STACK OF CASCADED NANOWIRES," which claimed priority to Chinese Application No. 201310274977.8, filed on Jul. 2, 2013. Both the PCT Application and the Chinese Application are incorporated herein by reference in their entireties.

TECHNICAL FIELD

The present disclosure relates to manufacture of semiconductor devices, and particularly, to a novel method of manufacturing a MOS transistor with a stack of cascaded nanowires.

BACKGROUND

In existing sub-20 nm technology, three-dimensional multi-gate devices such as FinFETs or tri-gate devices are predominant designs. Such designs can increase gate control capability and suppress leakage and Short Channel Effects (SCEs).

For example, double-gate SOI-based MOSFETs can suppress the SCEs and Drain Induced Barrier Lowering (DIBL) effects more effectively, have lower junction capacitances, and achieve lower channel doping, as compared with conventional single-gate bulk-Si-based or SOI-based MOSFETs. A substantially 2 times greater drive current can be achieved by appropriately setting a work function of a metal gate, resulting in a lower Equivalent Oxide Thickness (EOT) requirement. Further, a tri-gate device has a gate surrounding a top surface and opposite side surfaces of a channel region, and thus has more powerful gate control capability than the double-gate devices. Furthermore, all-around nanowire multi-gate devices are more advantageous.

Gate-all-around nanowire devices have better gate control capability, can suppress the SCEs more effectively, and thus are more advantageous in the scaling of sub-14 nm technology. However, such devices have problems such as tiny conductive channels, and thus cannot provide more drive currents in an effective silicon planar area.

For example, for a gate-all-around nanowire device with an effective line width of 1 μm, the device should has a dimension satisfying $d*n+(n-1)*s=1$ μm and $\pi*d*n>1$ μm, where d indicates a diameter of a single nanowire (NW), n indicates a number of NWs, and s indicates a pitch between the NWs. Therefore, in cases where the diameter d is 3 nm, 5 nm, 7 nm, and 10 nm, respectively, the pitch s between the NWs should be smaller than 6.4 nm, 10.6 nm, 15 nm, and 21.4 nm, respectively. As a result, to be comparable to a bulk-Si based device with a gate width of 1 μm, the NW device should have its NWs arranged in parallel very closely. According to existing exposure and etching techniques for FinFETs (with an interval between fins of about 60 nm), it is very difficult to achieve such a vertical arrangement of NWs with an extremely small pitch.

It is an effective way to increase the drive current by vertically stacking gate-all-around NWs. However, it is difficult to achieve or manufacture in practice. It is a challenging task to make it compatible with the conventional processes at low cost. For example, a conventional method of making stacked NWs comprises heteroepitaxy of Si/SiGe layers and selective etching. Specifically, a stack of alternating Si and SiGe layers may be formed on a Buried Oxide (BOX) by heteroepitaxy, and then the SiGe layers may be selectively removed by, for example, wet etching, to leave a stack of Si NWs. This method is seriously limited by the quality of the epitaxial layers, and incurs great cost. On the other hand, a conventional NW stack (where a gate fills in gaps between NWs, that is, each of the NWs is surrounded by a gate stack of HK/MG) has a relatively small total effective current per unit footprint, while a fin without stacked NWs has a greater effective conductive section (taken in a direction perpendicular to an extending direction of the fin, i.e., perpendicular to a channel) at the same footprint.

Therefore, there is a need for a novel NW device and a method of manufacturing the same, to, for example, increase an effective width of a conductive channel and thus improve a drive current.

SUMMARY

In view of the above, the present disclosure aims to provide, among others, a novel nanowire device and a method of manufacturing the same, by which it is possible to, for example, increase an effective width of a conductive channel and thus improve a drive current.

According to an embodiment of the present disclosure, there is provided a method of manufacturing a MOS transistor with stacked nanowires, comprising: forming a fin extending in a first direction on a substrate; forming a stack of cascaded nanowires from the fin; forming a gate stack extending in a second direction across the nanowire stack; and forming source and drain regions on opposite sides of the gate stack. The nanowires between the source and drain regions can serve as a channel region.

Forming the stack of cascaded nanowires from the fin may comprise operation A of laterally etching the fin to form grooves on side surfaces of the fin in the second direction, operation B of depositing a protection layer to fill the grooves, and repeating the operations A and B to form the nanowires.

Adjacent nanowires may be tangent to or intersect each other in a plane parallel to a surface of the substrate. A region where the adjacent nanowires intersect each other has a dimension less than 5% of that of the nanowire.

The grooves or the nanowires each may have a section shaped in rectangle, trapezoid, inverted trapezoid, circle, ellipse, Σ-shape, D-shape, C-shape, or any combination thereof.

Laterally etching the fin may comprise isotropic plasma dry etching with a lateral etching depth or a combination of isotropic etching and anisotropic etching.

Laterally etching the fin may comprise wet etching utilizing selective etching in different lattice orientations.

The method may further comprise, after formation of the nanowires, removing the protection layers to expose the nanowires and performing surface treatment and rounding on the nanowire stack.

The gate stack may be a dummy gate stack suitable for the gate last process. The method may further comprise, after formation of the source and drain regions, depositing an interlayer dielectric layer, removing the dummy gate stack to leave a gate groove, and depositing a further gate stack in the gate groove.

According to an embodiment of the present disclosure, there is provided a MOS transistor with stacked nanowires, comprising: a stack of cascaded nanowires extending in a first direction on a substrate; a gate stack extending in a second direction across the nanowire stack; source and drain regions disposed on opposite sides of the gate stack in the second direction; and a channel region constituted of the nanowire stack between the source and drain regions.

Adjacent nanowires may be tangent to or intersect each other in a plane parallel to a surface of the substrate.

A region where the adjacent nanowires intersect each other may have a dimension less than 5% of that of the nanowire.

The nanowires each may have a section shaped in rectangle, trapezoid, inverted trapezoid, circle, ellipse, Σ-shape, D-shape, C-shape, or any combination thereof.

According to embodiments of the present disclosure, the cascaded nanowires can be achieved at good quality by repeated operations of etching back, and lateral etching and then filling of grooves. As a result, it is possible to, at low cost, increase an effective width of the channel, increase a total area of an effective conductive section, and thus improve a drive current.

BRIEF DESCRIPTION OF THE DRAWINGS

Embodiments will be described with reference to the attached drawings, in which.

DETAILED DESCRIPTION

Embodiments and associated effects will be described in detail with reference to the attached drawings. A MOS transistor with stacked nanowires, which has a conductive channel with a significantly increased effective width and thus an increased drive current, and a method of manufacturing the same are illustrated. It is to be noted that like reference signs denote like elements. Terms "first," "second," "upper," "lower," and the like as used herein illustrate various elements or manufacture processes, but do not imply relative relationships in terms of space, order or level among those elements or processes, unless otherwise indicated.

Figure 9:
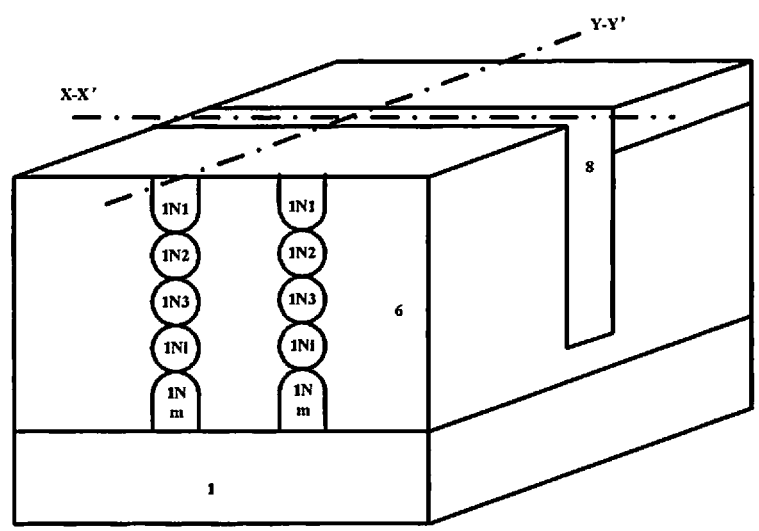
FIG. 9 is a perspective view showing a MOS transistor with stacked nanowires according to an embodiment of the present disclosure.

FIG. 9 is a perspective view showing a MOS transistor with stacked nanowires according to an embodiment of the present disclosure. As shown in FIG. 9, the MOS transistor with stacked nanowires may comprise a stack of cascaded nanowires extending in a first direction on a substrate, a gate extending in a second direction across the nanowire stack, source and drain regions disposed on opposite sides of the nanowire stack extending in the first direction, and a channel region constituted of the nanowire stack between the source and drain regions. In the example of FIG. 9, a plurality of (specifically, two) nanowire stacks are shown, and the gate may extend continuously across the stacks. The gate, for example, a metal gate, may surround the channel region.

A method of manufacturing a device according to an embodiment of the present disclosure will be described in detail with reference to sectional views shown in FIGS. 1 to 8. Left portions of those figures are sectional views taken in a direction perpendicular to a channel (i.e., in a second direction, that is, a direction of an X-X' axis), and right portions of those figures are sectional views taken in a direction parallel to the channel (i.e., in a first direction, that is, a direction of a Y-Y' axis).

Figure 1:
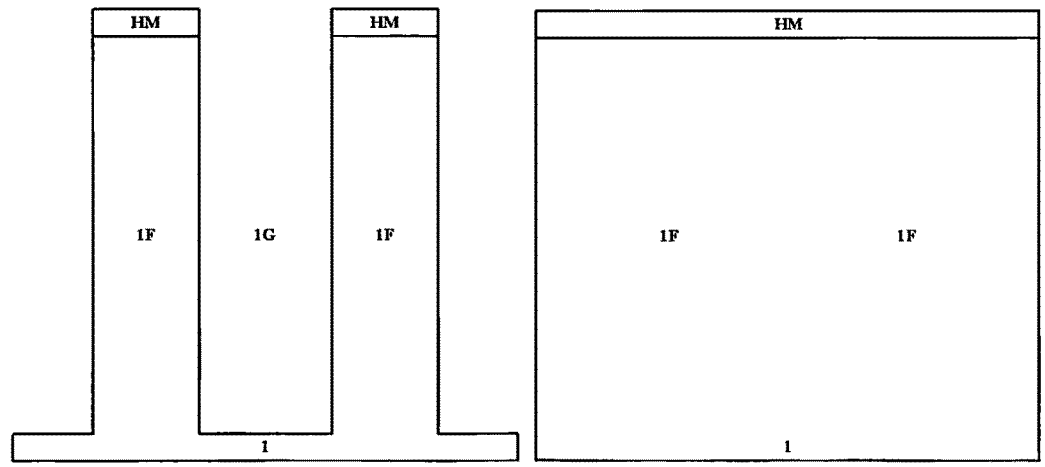
FIGS. 1 to 8 are sectional views showing a method of manufacturing a MOS transistor with stacked nanowires according to an embodiment of the present disclosure.

Referring to FIG. 1, a substrate 1 may be provided. The substrate 1 may comprise various materials depending on intended applications, for example, single-crystal bulk silicon (Si), single-crystal bulk germanium (Ge), strained Si, silicon germanium (SiGe), compound semiconductor, such as gallium nitride (GaN), gallium arsenide (GaAs), indium phosphide (InP), and indium antimonide (InSb), or carbon-based semiconductor, such as graphene, SiC, and carbon nanotubes. For compatibility with CMOS processes, the substrate 1 may comprise bulk Si.

A plurality of fins extending in the first direction (the Y-Y' axis as shown in FIG. 9) may be formed. Here, the first direction indicates a channel extending direction of the device to be formed. For example, the substrate 1 may be etched to form a plurality of grooves 1G extending substantially parallel to each other in the first direction. Remaining portions of the substrate 1 between the respective grooves 1G constitute the fins 1F. The grooves 1G each may have a depth to width ratio greater than 5:1. A hard mask layer HM may be deposited on top of the fins. The HM may comprise any of silicon oxide, silicon nitride, silicon oxynitride, or any combination thereof. In this example, the HM may comprise silicon nitride.

Figure 2:
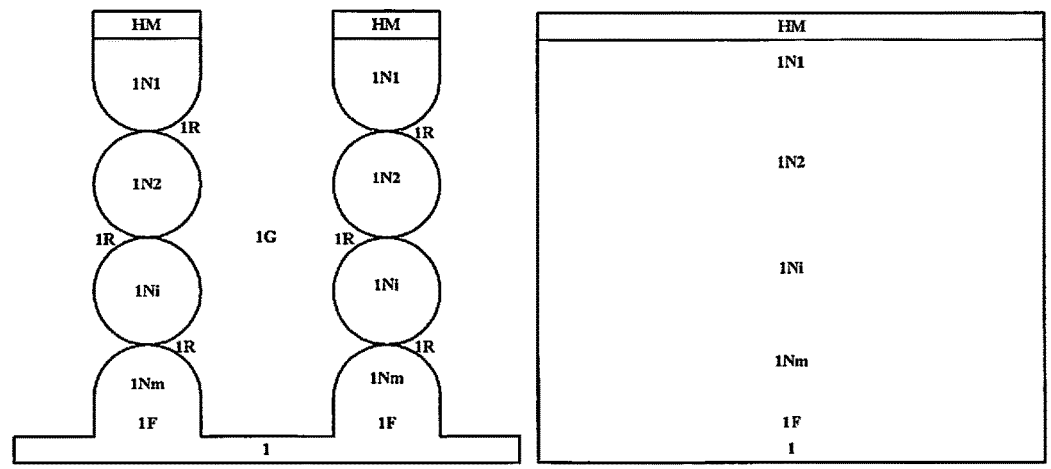

Referring to FIG. 2, each of the fins 1F may be etched to form stacks of cascaded nanowires 1N1-1Nm. Specifically, side surfaces of each of the fins 1F may be laterally etched in the second direction (the X-X' axis as shown in FIG. 9) substantially perpendicular to the first direction by dry etching or wet etching with HM as a mask, resulting in continuous inward recesses 1R formed in the side surfaces of each of the fins 1F (here "inward" means a direction extending from the side surface substantially perpendicularly towards a center of 1F). As a result, remaining portions of the fins 1F constitute the stacks of cascaded nanowires, each stack including a plurality of nanowires 1N1, 1N2, . . . , 1Nm from the top down, where m is a natural number greater than 1. For example, m may be 2-10 depending on device performances to be achieved. Adjacent nanowires 1Ni and 1Nj (where i and j are different natural numbers) may have a connection, which can be achieved by vertices of the adjacent nanowires. In a case where the nanowires each have a circular section, the vertex may be a point of tangency between two adjacent circles; while in a case where the nanowires each have a polygonal section such as rectangle or diamond, the vertex may be a common vertex of two adjacent polygons. In other words, adjacent nanowires may have respective tangent planes with each other. Alternatively, the connection may have a certain dimension (in the second direction), for example, a certain thickness/height/weight determined by the etching process (and a length in the first direction substantially identical to that of the nanowire). The thickness/height/weight of the connection may be less than 5% of the dimension (thickness/height/weight) of the nanowire itself (and thus the connection is illustrated as an ideal point of tangency in the sectional view). For example, the dimension of the connection could be in the order of 1 nm or less.

The process of etching the fins 1F to form the nanowire stacks 1N may comprise isotropic fluorine-based or chlorine-based plasma dry etching or TMAH wet etching. Process parameters such as etching temperature may be selected to improve the etching of the side surfaces. For example, the etching process may comprise Reactive Ion Etching (RIE), with fluorine-based or chlorine-based gas, such as $NF_3$, $SF_6$, CF$_4$, CH$_2$F$_2$, CH$_3$F, CHF$_3$, Cl$_2$, or any combination thereof, as etching gas. It is possible to control the recesses 1R to be in different shapes, such as rectangle, trapezoid, inverted trapezoid, Σ-shape (a combination of several lines connected together), C-shape (beyond ½ of a curved surface, such as a circular surface, an elliptic surface, or a hyperbolic surface), or D-shape (about ½ of a curved surface, such as a circular surface, an elliptic surface, or a hyperbolic surface), by controlling the etching process parameters. As a result, the nanowires 1N1-1Nm each may have a section shaped in circle, ellipse, rectangle, diamond, trapezoid, inverted trapezoid, C-shape, D-shape, Σ-shape, or any other polygons or curved surfaces. In each of the nanowire stacks, the upper most one (1N1) and the lower most one (1Nm) each may be only a portion of such a section, such as a half-circle.

According to an example, the etching process to form the nanowire stacks 1N may be performed as follows.

A temporary protection layer (or STI2 to be described later) may be deposited and then etched back to expose a portion of each of the fins 1F. First grooves (not shown) may be etched laterally in the exposed portion of each of the fins 1F in the first direction, to expose an upper portion of each of the fins 1F above the STI2 (which portion serves as an upper most channel). Side surfaces of each of the first grooves may look like a rectangle, a trapezoid, an inverted trapezoid, a Σ-shape (a combination of several lines connected together), a C-shape (beyond ½ of a curved surface, such as a circular surface, an elliptic surface, or a hyperbolic surface), or a D-shape (about ½ of a curved surface, such as a circular surface, an elliptic surface, or a hyperbolic surface). The etching process may comprise fluorine-based or chlorine-based plasma dry etching or TMAH wet etching, based on the material of the fins.

Then, a first protection layer may be deposited on the entire arrangement. The first protection layer may comprise silicon oxide, silicon nitride, amorphous silicon, amorphous germanium, amorphous carbon, or any combination thereof. The first protection layer may comprise a material different from that of the temporary protection layer or the STI 2, so as not to be undesirably removed during later etching processes.

The first protection layer may be anisotropically etched by, for example, carbon-fluorine-hydrogen-based gas plasma etching, to expose the upper most nanowire and the STI 2. Components of the etching gas may be adjusted so that the STI 2 (e.g., silicon oxide) is subjected to substantially no etching while only the first protection layer (e.g., silicon nitride) is etched.

The STI 2 may be etched back to expose a middle portion of each of the fins 1F. For example, the STI 2 (e.g., silicon oxide) may be etched by HF-based wet etching or anisotropic fluorine-based plasma dry etching. The exposed middle portion will serve as a channel region, specifically, a middle layer of the nanowire stack. The lower most portion may be etched to serve as an isolation region.

Then, the above operations may be repeated, such as, etching to form second grooves, depositing a second protection layer, anisotropically etching the second protection layer, etching back the STI 2 to expose a further portion of each of the fins 1F, etching to form third grooves, depositing a third protection layer, anisotropically etching the third protection layer, and so on. This will result in the arrangement shown in FIG. 2. Processes such as surface treatment and rounding may be carried out, so that the nanowires 1N1, 1N2, . . . , 1Nm achieved by dry etching processes may have their sections rounded, to improve symmetry of gates and channel regions and thus uniformity of device performances.

The processes such as surface treatment and rounding may be performed by surface oxidation and then wet microetching. The surface oxidation may comprise oven thermal oxidation, oxidation by strong oxidant solution, or the like. The processes such as surface treatment and rounding may be performed by baking at a high temperature in atmosphere of hydrogen, isotropic etching, or the like.

According to a further example, the etching process to form the nanowire stacks 1N may be performed as follows.

With the HM layer on top of the fins as a mask, vertical etching may be performed at strongly anisotropic conditions (for example, a relatively greater content of HBr, a relatively higher power, a relatively lower pressure, or the like). The side surfaces of the fins of silicon may be passivated by a polymer (such as low-K materials). Then, isotropic etching may be performed at strongly isotropic conditions (for example, a relatively less content of HBr, a relatively greater content of Cl, a relatively lower power, a relatively higher pressure, or the like). The etching occurs in both the vertical direction and the horizontal direction, during which upper portions of the side surfaces will not be etched due to the protection by the polymer. Such operations may be repeated to form the cascaded nanowires (NWs). The time of transition from the anisotropic etching to the isotropic etching and the etching conditions may be adjusted so that the cascaded NWs are tangent to or intersect each other, resulting in the arrangement shown in FIG. 2.

Figure 3:
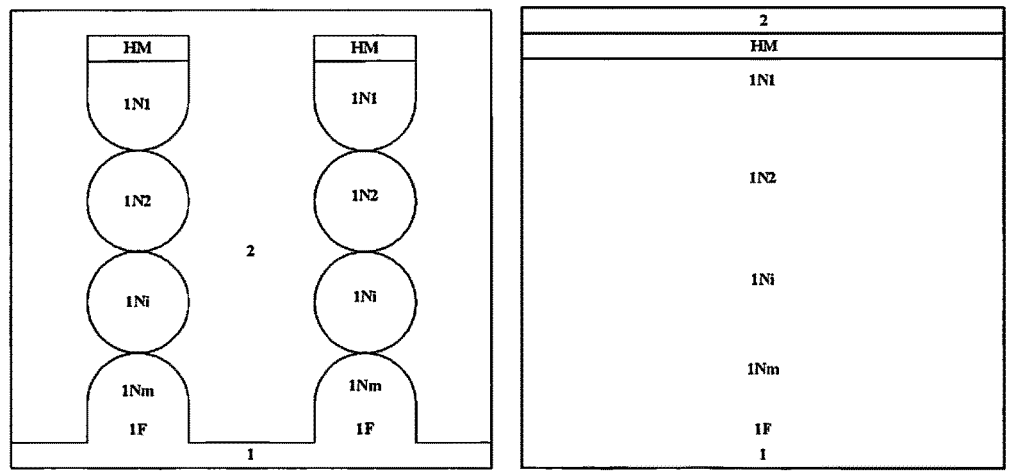

Referring to FIG. 3, an insulating isolation dielectric layer (e.g., silicon oxide, silicon oxynitride, silicon oxycarbide, or low-K materials) may be filled in the grooves 1G between the respective nanowire stacks 1N by means of, for example, PECVD, HDPCVD, RTO, or the like, to form Shallow Trench Isolation (STI) 2. The STI 2 may be planarized by, for example, CMP or etching back, until the hard mask layer HM is exposed.

Figure 4:
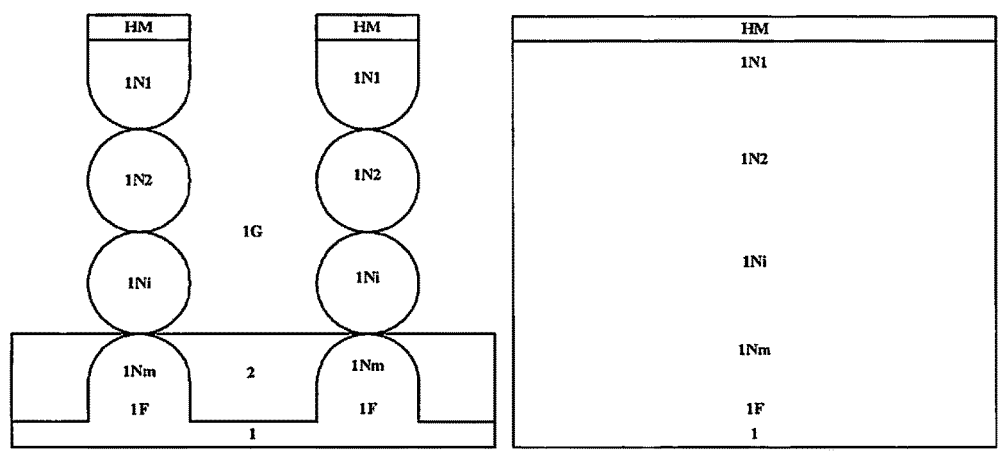

Referring to FIG. 4, the STI 2 may be etched back to expose a major portion of each of the nanowire stacks 1N, with only several (for example, 1 or 2) lower nanowires 1Nj-1Nm left inside the STI 2. The STI 2 of e.g. silicon oxide may be removed by HF-based wet etching or fluorine-based plasma dry etching. The exposed portion of each of the nanowire stacks will serve as the channel region, while the lower most portion may be etched to serve as the isolation region. The hard mask layer HM may be removed by wet etching.

Figure 5:
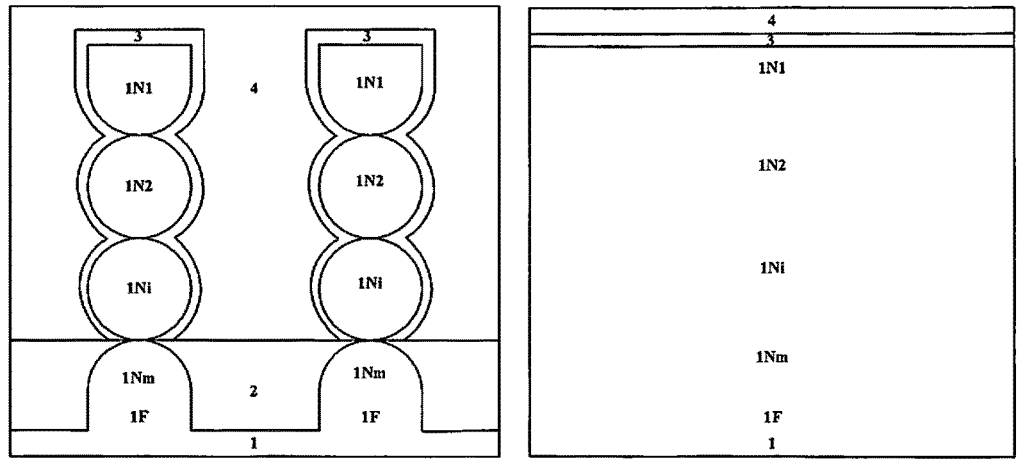

Referring to FIG. 5, in the grooves 1G which are exposed again between the respective nanowire stacks 1N, stacked layers for a dummy gate may be filled. Specifically, a pad oxide layer 3 (e.g., silicon oxide) may be formed on the STI 2 and the nanowire stacks 1N by means of, for example, LPCVD, PECVD, HDPCVD, RTO, or chemical oxidation, to protect the nanowire stacks 1N from being over etched in subsequent etching processes. Further, a dummy gate layer 4 may be formed on the pad oxide layer 3 by means of, for example, PECVD, HDPCVD, MOCVD, MBE, ALD, evaporation, or sputtering. The dummy gate layer 4 may comprise poly-silicon, amorphous silicon, microcrystalline silicon, amorphous carbon, poly-germanium, amorphous germanium, or any combination thereof. Those layers are not drawn to scale in the figure, and may have their dimensions, such as thickness, reasonably determined based on intended device dimensions and electrical performance requirements. Here, the stacked layers 3/4 for the dummy gate may substantially completely surround the respective nanowires 1N1-1Nm.

Figure 6:
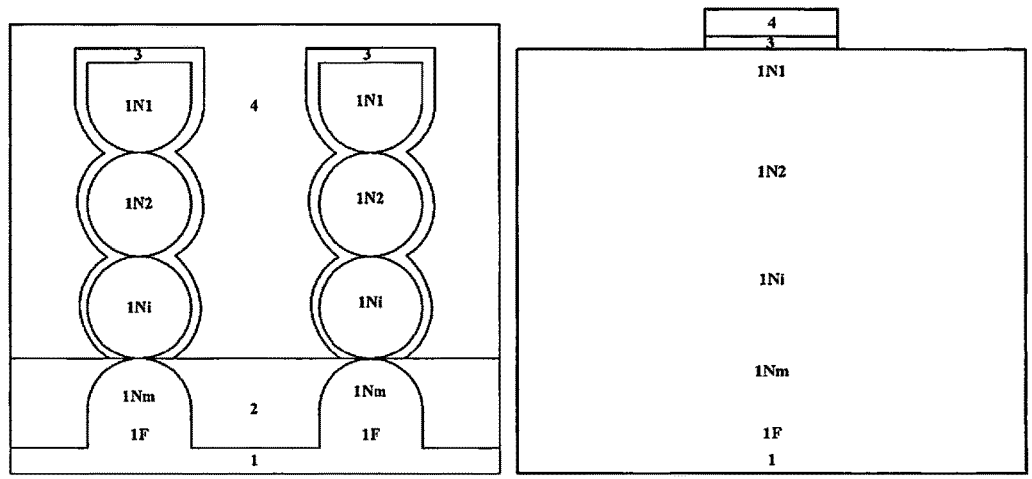

Referring to FIG. 6, the stacked layers 3/4 for the dummy gate may be etched to form a dummy gate stack. For example, the stacked layers 3/4 for the dummy gate may be etched by known patterning techniques to expose the nanowire stacks (specifically, the upper most nanowire 1N1), so that some portions of the stacked layers 3/4 on opposite sides of each of the nanowire stacks 1N in the first direction are removed, while several dummy gate stacks (of which only one is shown in the figure) left on the nanowire stacks 1N.

Figure 7:
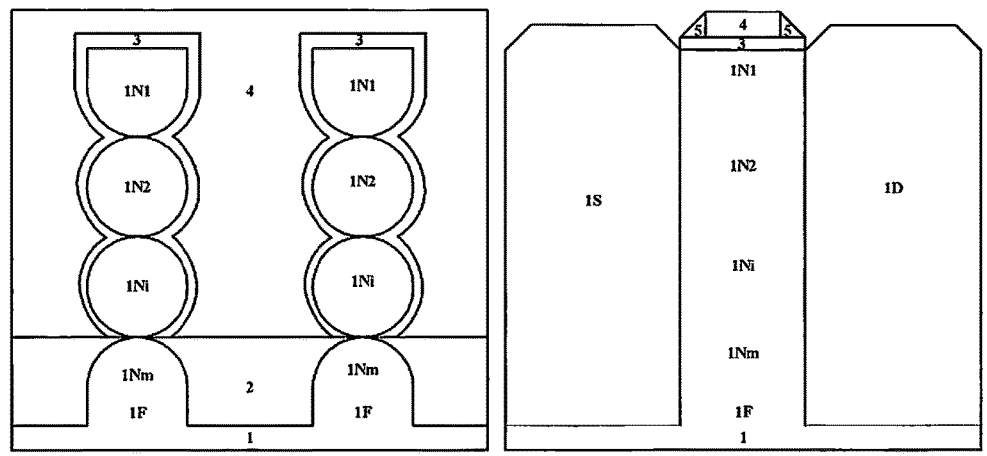

Referring to FIG. 7, source and drain regions 1S and 1D may be formed on opposite sides of the nanowire stacks 1N in the first direction. According to an example, the nanowire stacks 1N may be etched to expose the substrate 1, and then raised source and drain regions 1S and 1D may be formed by selective epitaxy such as UHVCVD, MOCVD, ALD, MBE, or atmospheric pressure epitaxy. The source and drain regions 1S and 1D may comprise the same material as the substrate 1 (e.g., Si). Alternatively, the source and drain regions may comprise SiGe, SiSn, GeSn, Si, or any combination thereof for a PMOS device, to apply compressive stress to the channel region 1C to improve hole mobility; and Si:C, Si:H, SiGe:C, Si, or any combination thereof for an NMOS device, to apply tensile stress to the channel region 1C to improve electron mobility. The source and drain regions may be in-situ doped during epitaxy, or may be doped by implantation after epitaxy, and then activated by annealing, so that the source and drain regions 1S and 1D may have different doping type and concentration from the substrate 1, to control electrical properties of the device. The source and drain regions 1S and 1D may have their top surfaces higher than those of the nanowire stacks 1N. Spacers 5 may be formed on opposite side surfaces of the gate stack in the first direction, and then used to form lightly doped extensions and heavily doped source/drain regions (not shown).

Figure 8:
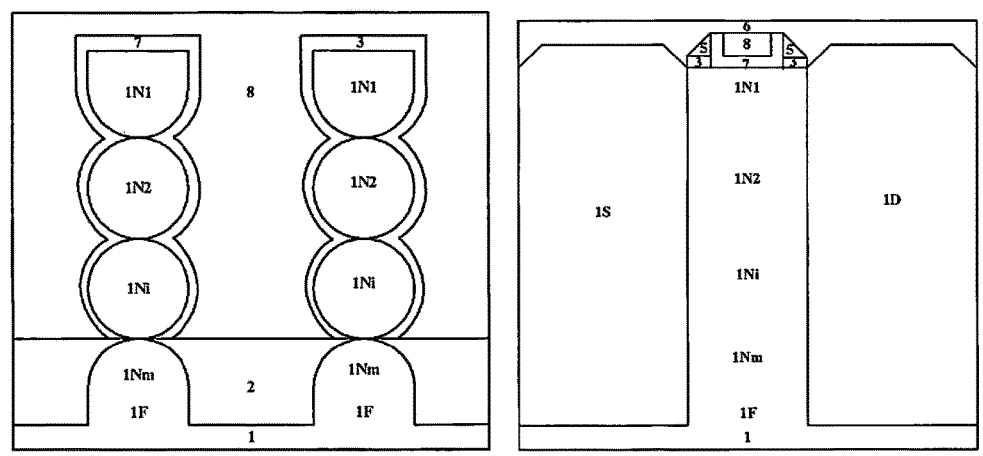

Referring to FIG. 8, the manufacture continues with a gate last process. An Interlayer Dielectric Layer (IDL) 6 may be formed on the entire arrangement, and the dummy gate stack 3/4 may be removed by wet etching, leaving a gate groove (not shown) in the ILD 6. A high-K gate dielectric layer 7 and a metal gate conductor layer 8 may be sequentially deposited into the gate groove, to form a gate stack. The gate stack may be planarized by CMP until the ILD 6 is exposed. After that, source/drain contact holes (not shown) may be etched in the ILD 6 to access the source and drain regions 1S and 1D, a barrier layer (e.g., metal nitride) and a conductive layer (e.g., metal) may be deposited into the contact holes to form source/drain plugs (not shown), according to standard processes.

The resultant device is shown in FIG. 9. As shown in FIG. 9, the device may comprise a stack of cascaded nanowires extending in a first direction on a substrate, a gate extending in a second direction across the nanowire stack, source and drain regions disposed on opposite sides of the nanowire stack extending in the first direction, and a channel region constituted of the nanowire stack between the source and drain regions. Adjacent nanowires may be tangent to each other. Alternatively, adjacent nanowires may have a connection region, which has a dimension less than 5% of that of the nanowire. For details, such as materials and geometric shapes, of these features, reference may be made to the above descriptions.

According to embodiments of the present disclosure, the cascaded nanowires can be achieved at good quality by repeated operations of etching back, and lateral etching and then filling of grooves. As a result, it is possible to, at low cost, increase an effective width of the channel, increase a total area of an effective conductive section, and thus improve a drive current.

Though the technology of the present disclosure has been described with reference to the embodiments thereof, it is to be appreciated by those skilled in the art that various modifications and equivalents may be made therein without departing from the teaching of the present disclosure. All such modifications and equivalents are intended to fall within the scope of the present disclosure. Accordingly, the technology is not limited except as by the appended claims.

We claim:

1. A method of manufacturing a MOS transistor with stacked semiconductor nanowires, comprising:
   forming a fin extending in a first direction on a substrate;
   forming, in the fin, a stack of cascaded semiconductor nanowires, which directly contact each other;
   forming a gate stack extending in a second direction across the semiconductor nanowire stack; and
   forming source and drain regions on opposite sides of the gate stack, such that the stack of cascaded semiconductor nanowires are included in a channel region defined between the source and drain regions;
   wherein the semiconductor nanowires between the source and drain regions serve as a channel region.

2. The method according to claim 1, wherein forming the stack of cascaded semiconductor nanowires from the fin comprises:
   operation A of laterally etching the fin to form grooves on side surfaces of the fin in the second direction;
   operation B of depositing a protection layer to fill the grooves; and
   repeating the operations A and B to form the semiconductor nanowires.

3. The method according to claim 2, wherein adjacent semiconductor nanowires are tangent to or intersect each other in a plane parallel to a surface of the substrate.

4. The method according to claim 3, wherein a region where the adjacent semiconductor nanowires intersect each other has a dimension less than 5% of that of the diameter of the semiconductor nanowire.

5. The method according to claim 2, wherein the grooves or the semiconductor nanowires each have a section shaped in rectangle, trapezoid, inverted trapezoid, circle, ellipse, Σ-shape, D-shape, or C-shape.

6. The method according to claim 2, wherein laterally etching the fin comprises isotropic plasma dry etching with a lateral etching depth or a combination of isotropic etching and anisotropic etching.

7. The method according to claim 2, wherein laterally etching the fin comprises wet etching utilizing selective etching in different lattice orientations.

8. The method according to claim 2, further comprising, after formation of the semiconductor nanowires, removing the protection layers to expose the semiconductor nanowires and performing surface treatment and rounding on the semiconductor nanowire stack.

9. The method according to claim 1, wherein the gate stack is a dummy gate stack, and the method further comprises, after formation of the source and drain regions, depositing an interlayer dielectric layer, removing the dummy gate stack to leave a gate groove, and depositing a further gate stack in the gate groove.

10. A MOS transistor with stacked semiconductor nanowires, comprising:

a stack of cascaded semiconductor nanowires directly contacting each other and extending in a first direction on a substrate;

a gate stack extending in a second direction across the semiconductor nanowire stack;

source and drain regions disposed on opposite sides of the gate stack in the second direction; and a channel region constituted of the semiconductor nanowire stack between the source and drain regions.

11. The MOS transistor with stacked semiconductor nanowires according to claim 10, wherein adjacent semiconductor nanowires are tangent to or intersect each other in a plane parallel to a surface of the substrate.

12. The MOS transistor with stacked semiconductor nanowires according to claim 11, wherein a region where the adjacent semiconductor nanowires intersect each other has a dimension less than 5% of that of the diameter of the semiconductor nanowire.

13. The MOS transistor with stacked semiconductor nanowires according to claim 10, wherein the semiconductor nanowires each have a section shaped in rectangle, trapezoid, inverted trapezoid, circle, ellipse, $\Sigma$-shape, D-shape, or C-shape.

* * * * *